United States Patent [19]

Kao et al.

[11] Patent Number: 5,391,515
[45] Date of Patent: Feb. 21, 1995

[54] CAPPED ANNEAL

[75] Inventors: Yung-Chung Kao; Donald L. Plumton, both of Dallas, Tex.

[73] Assignee: Texas Instruments Incorporated, Dallas, Tex.

[21] Appl. No.: 900,226

[22] Filed: Jun. 17, 1992

Related U.S. Application Data

[63] Continuation of Ser. No. 623,488, Dec. 4, 1990, abandoned, which is a continuation of Ser. No. 264,237, Oct. 28, 1988, abandoned.

[51] Int. Cl.$^6$ .......................................... H01L 21/324
[52] U.S. Cl. ..................... 437/133; 437/247; 437/912; 148/DIG. 3; 148/DIG. 65
[58] Field of Search ............... 148/DIG. 3, DIG. 65, 148/DIG. 72; 437/126, 133, 912, 247, 132

[56] References Cited

U.S. PATENT DOCUMENTS

| | | |
|---|---|---|
| 4,267,014 | 5/1981 | Davey et al. . |
| 4,494,997 | 1/1985 | Lemnios et al. . |
| 4,561,916 | 12/1985 | Akiyama et al. . |
| 4,642,879 | 2/1987 | Kawata et al. . |
| 4,699,688 | 10/1987 | Shastry . |
| 4,900,372 | 2/1990 | Lee et al. . |
| 4,910,164 | 3/1990 | Shichijo ................................ 437/90 |
| 4,914,053 | 4/1990 | Matyi et al. .......................... 437/90 |
| 5,183,776 | 2/1993 | Lee ...................................... 437/110 |
| 5,185,288 | 2/1993 | Cook et al. .......................... 437/133 |
| 5,238,869 | 8/1993 | Shichijo et al. ...................... 437/126 |
| 5,246,878 | 9/1993 | Bhat et al. ........................... 437/133 |

OTHER PUBLICATIONS

Lee, et al., "Ion Implantation and Annealing Properties of Molecular-Beam Epitaxy Grown GaAs-on-Si", *J. Vac. Sci. Technol.*, pp. 827–830, B 5(3), May/Jun. 1987.
Lee, et al., "Epitaxy of GaAs on Si: MBE and OMCVD", Mat. Res. Soc. Symp. Proc., pp. 33–44, vol. 91, 1987.
Soga, et al., "Epitaxial Growth and Material Properties of GaAs on Si Grown by MOCVD", *Journal of Crystal Growth*, pp. 498–502, 1986.
Chand, et al., "GaAs Avalanche Photodiodes and the Effect of Rapid Thermal Annealing on Crystalline Quality of GaAs Grown on Si by Molecular-Beam Epitaxy", *J. Vac. Sci. Technol.*, pp. 822–826, B 5(3), May/Jun. 1987.
Lee, et al., "Defect Reduction by Thermal Annealing of GaAs Layers Grown by Molecular Beam Epitaxy on Si Substrates", *50 Appl. Phys. Lett.*, 31, 1987.
Kojima, et al., "Layer-by-Layer Sublimation Observed by Reflection High-Energy Electron, Diffraction Intensity Oscillation in a Molecular Beam Epitaxy System", *47 Appl. Phys. Lett.*, Aug. 1985.
Van Hove, et al., "Mass-Action Control of AlGaAs and GaAs Growth in Molecular Beam Epitaxy", *47 Appl. Phys. Lett.*, pp. 726–728, 7, Oct. 1, 1985.
Kawabe, et al., "Preferential Desorption of Ga from $Al_xGa_{1-x}As$ Grown by Molecular Beam Epitaxy", *23 Jpn. J. Appl. Phys.*, pp. L351, vol. 23, No. 6, Jun. 1984.
Tanaka, et al., "Single-Longitudinal-Mode Selfaligned (AlGa)As Double-Heterostructure Lasers Fabricated by Molecular Beam Epitaxy", *24 Jpn. J. Appl. Phys.*, pp. L89, vol. 24, No. 2, Feb. 1985.
Chang, et al., "Interdiffusion Between GaAs and AlAs", *29 Appl. Phys. Lett.*, pp. 138–140, 1976.
Heckingbottom, "Thermodynamic Aspects of Molecular Beam Epitaxy: High Temperature Growth in the $GaAs/Ga_{1-x}Al_xAs$ System", *3 J. Vac. Sci. Technol.*, pp. 572–575, Mar./Apr. 1985.

Primary Examiner—Mary Wilczewski
Attorney, Agent, or Firm—Michael K. Skrehot; James C. Kesterson; Richard L. Donaldson

[57] ABSTRACT

Heteroepitaxy of lattice-mismatched semiconductor materials such as GaAs on silicon is accomplished by first growing GaAs (104) on silicon (102), then growing a lattice matched cap of $Al_xGa_{1-x}As$ (106), next annealing out defects with the $Al_xGa_{1-x}As$ cap (106) limiting desorption of gallium, lastly growing further GaAs (110) directly on the cap. The lattice matched cap is also used as an implant anneal cap.

7 Claims, 5 Drawing Sheets

CAPPED ANNEAL

This invention was made with Government support under Contact N00014-87-K-0847, awarded by the Department of the Navy. The Government has certain rights in this invention.

This is a continuation of application Ser. No. 07/623,488, filed Dec. 4, 1990, now abandoned, which is a continuation of application Ser. No. 07/264,237, filed Oct. 28, 1988, now abandoned.

CROSS-REFERENCE TO RELATED APPLICATIONS

Copending U.S. applications Nos. 912,028, filed Sep. 26, 1986 (J. W. Lee), 94,231, filed Sep. 8, 1987 (Matyi and Shichijo), now U.S. Pat. No. 4,914,053 224,428, filed Jul. 25, 1988 (Shichijo and Matyi), and 224,965, filed Jul. 27, 1988 (Shichijo), now U.S. Pat. No. 4,910,164 disclose related subject matter. These cross-referenced applications are assigned to the assignee of the present application.

BACKGROUND OF THE INVENTION

1. Field of the Invention.

The present invention relates to growth of semiconductor materials and devices, and, more particularly, to heteroepitaxial growth such as gallium arsenide on silicon and devices in such heterostructures.

(2) Description of the Related Art.

Many researchers have investigated growth of semiconductor-device quality gallium arsenide (GaAs) on silicon wafers and fabrication of active devices in the GaAs. Such devices would combine the higher mobility of carriers in GaAs with the greater mechanical strength and thermal conductivity of a silicon substrate. For example, R. Fischer et al, GaAs/AlGaAs Heterojunction Bipolar Transistors on Si Substrates, 1985 IEDM Tech. Digest 332, report GaAs/AlGaAs heterojunction bipolar transistors grown on silicon substrates and having current gains of $\beta=13$ for a 0.2 $\mu$m thick base. Similarly, G. Turner et al, Picosecond Photodetector Fabricated in GaAs Layers Grown on Silicon and Silicon On Sapphire Substrates, 1985 IEDM Tech. Digest 468, report response times of 60 picoseconds for photoconductive detectors fabricated in GaAs on silicon. These articles also note that majority carrier devices such as MESFETs fabricated in GaAs on silicon have performance approaching that of homoepitaxial devices; and this has encouraged efforts to integrate GaAs/AlGaAs optoelectronic and high-frequency devices and silicon devices on the same wafer to utilize hi,h-data-rate optical interconnections to reduce the number of wire interconnections. Selective recrystallization of amorphous GaAs can use the high resistivity of noncrystalline GaAs; see, for example, A. Christou et al, Formation of (100) GaAs on (100) Silicon by Laser Recrystallization, 48 Appl. Phys. Lett. 1516 (1986).

One of the key limitations in the implementation of device structures based on heteroepitaxial GaAs on silicon has been the 4.1% difference in lattice parameters between the two materials. This lattice mismatch leads to the formation of a network of misfit dislocations at the heterointerface; under typical epitaxial growth conditions, a significant fraction of these misfit defects thread away from the interface and into the GaAs regions where devices are subsequently fabricated. It is the presence of these threading dislocations (which can serve as recombination and scattering centers) that has seriously limited the implementation of GaAs on silicon technology.

A number of schemes have been reported for either annihiliating or retarding the propagation of threading dislocations in lattice mismatched semiconductors such as GaAs on silicon. Notably among these is post-growth thermal annealing for defect reduction; see J. W. Lee et al, 50 Appl. Phys. Left. 31 (1987), Choi et al, 50 Appl. Phys. Lett. 992 (1987), and N. Chand et al, 49 Appl. Phys. Lett. 815 (1986). Post-growth annealing by itself has been shown to be effective at reducing the global defect in GaAs layers on silicon substrates; however, there is insufficient data at this time to determine its effectivenes at lowering the density of device degrading threading dislocations. Similarly, Fan et al., U.S. Pat. No. 4,632,712, interrupts the GaAs growth to trap threading dislocations. Alternatively, a number of workers have studied the use of either compositional or thermally cycled superlattices during the growth process for dislocation control; see J. W. Lee, Proc. 1986 Int'l. Symp. on GaAs and Related Compounds 111 (1987), T. Soga et al, 26 Japan. J. Appl. Phys. L536 (1987), R. D. Dupuis et al, 50 Appl. Phys. Left. 407 (1987). It appears from this literature that the primary effect of an intermediary superlattice is to deflect the threading dislocations by the imposition of a strain field (either by thermal effects in the case of the thermally cycled layer or by lattice dilations in the case of chemical superlattices) in such a way that they tend to propagate parallel instead of obliquely to the heterointerface. See Szilagyi et al, 4 J. Vac. Sci. Tech. A 2200 (1986).

However, the known methods still have unacceptably high threading dislocation densities for GaAs epitaxially grown on silicon.

Various researchers have investigated the loss of gallium and aluminum during MBE growth and high temperature treatment of GaAs and $Al_xGa_{1-x}as$; see T. Kojima et al, Layer-by-layer Sublimation Observed by Reflection High-energy Electron Diffraction Intensity Oscillation in a Molecular Beam Epitaxy System, 47 Appl. Phys. Lett. 286 (1985), J. Van Hove et al, Massaction Control of AlGaAs and GaAs growth in Molecular Beam Epitaxy, 47 Appl. Phys. Lett. 726 (1985), M. Kawabe et al, Preferential Desorption of Ga from $Al_xGa_{1-x}As$ Grown by Molecular Beam Epitaxy, 23 Jpn. J. Appl. Phys. L351 (1984), H. Tanaka et al, Single-Longitudinal-Mode Selfaligned (AlGa)As Double-Heterostructure Lasers Fabricated by Molecular Beam Epitaxy, 24 Jpn. J. Appl. Phys. L89 (1985), and R. Heckingbottom, Thermodynamic Aspects of Molecular Beam Epitaxy: High Temperature Growth in the $GaAs/Ga_{1-x}Al_xAs$ System, 3 J. Vac. Sci. Tech. B 572 (1985). The research shows that gallium is lost at a much greater rate than aluminum and $Al_xGa_{1-x}As$ actually forms a surface layer of AlAs which retards further loss of gallium.

In emitter-up HBT technology the use of MOCVD to deposit an overgrowth emitter onto a zinc implanted base was recently demonstrated; see J. W. Tully, "A Fully Planar Heterojunction Bipolar Transistor," 7 IEEE Elec. Dev. Lett., 203 (1986) and J. W. Trully, W. Hant, and B. B. O'Brien, "Heterojunction Bipolar Transistors with Ion-Implanted Bases,"7 IEEE Elec. Dev. Lett., 615 (1986) After such an implantation the implanted dopant must be activated and the implant damage must be removed while the surface perfection is maintained since the surface will be the active base/e- mitter interface. However, known methods have the problem of arsenic loss during the anneal or stress induced by an anneal cap.

SUMMARY OF THE INVENTION

The present invention provides a lattice matched annealing cap for semiconductor layers, both for heteroepitaxial growth and for implant activation, and devices fabricated with the annealed semiconductor. Preferred embodiments include heteroepitaxially grown GaAs on silicon with an $Al_xGa_{1-x}As$ capping layer plus further GaAs grown on the capping layer after the anneal; devices are fabricated in this further GaAs layer. Other preferred embodiments include $Al_xGa_{1-x}As$ capping of GaAs followed by implantation of dopants through the $Al_xGa_{1-x}As$ plus an activation anneal for fabrication of devices such as MESFETs and heterojunction bipolar transistors.

BRIEF DESCRIPTION OF THE DRAWINGS

The drawings are schematic for clarity.

DESCRIPTION OF THE PREFERRED EMBODIMENTS

Figure 1:
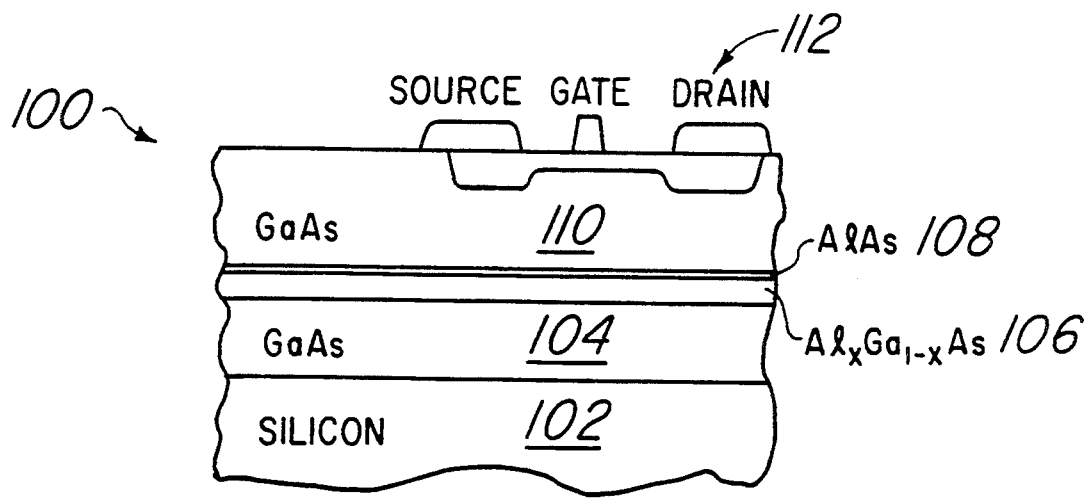
FIG. 1 is a cross sectional elevation view of a first preferred embodiment structure.

The first preferred embodiment heteroepitaxial structure, shown in schematic cross sectional elevation view in FIG. 1 and generally denoted 100, includes silicon substrate 102, 1.5 μm thick GaAs buffer layer 104, 0.1 μm thick $Al_x Ga_{1-x}As$ layer 106, AlAs layer 108 which is only a few atomic layers thick, and GaAs layer 110 of thickness 2.5 microns. Active devices such as MESFET 112 and JFETs may be fabricated in GaAs layer 110, or layer 110 could be grown to include both GaAs and $Al_xGa_{1-x}As$ layers and heterojunction bipolar transistors fabricated in layer 110.

The first preferred embodiment method of fabrication of the first preferred embodiment structure includes the time-temperature growth illustrated in FIG. 2 and the steps illustrated in cross sectional elevation view in FIGS. 3a–d as follows:

(a) Insert silicon substrate 102 (about 3 inches in diameter and 25 mils thick and oriented in the (100) direction) into a molecular beam epitaxy (MBE) machine and clean by baking at 950 C. for ten to fifteen minutes in ultrahigh vacuum; this removes surface contaminants such as native oxide from substrate 102. See the lefthand portion of FIG. 2 showing the 950 C. temperature run.

(b) Lower the temperature of substate 102 to 450 C. and slowly (0.3 μm per hour) grow a GaAs layer about 0.2 μm thick; this low temperature grow provides an initial buffer layer that helps confine misfit dislocations due to the 4.1% lattice mismatch between silicon and GaAs. Stop the low temperature GaAs growth. Raise the temperature of substrate 102 to 550 C. and grow 1.3 μm of GaAs at a rate of about 0.9 per hour to complete buffer layer 104. See the left center of FIG. 2 showing the two GaAs growth runs and FIG. 3a for a cross sectional elevation view. An alternative method would be to continue the GaAs growth as the substrate temperature is raised from 450 to 550.

(c) While maintaining the substrate temperature at 550 C. change from the growth of GaAs to the growth of $Al_xGa_{1-x}As$, and grow 0.1 μm thick layer 106 of $A_xGa_{1-x}As$ with $x = 0.32$. See the center of FIG. 2 and FIG. 3b.

(d) Stop the growth of $Al_xGa_{1-x}As$ and raise the temperature of substrate 102 to 850 C. for five to fifteen minutes to anneal out the twins, stacking faults, and most of the threading dislocations in buffer layer 104 (and $Al_xGa_{1-x}As$ layer 106). During this anneal an arsenic atmosphere (about $10^{-5}$ torr) is maintained to keep the surface arsenic stablized. The gallium preferentially desorbs from the surface leaving the aluminum behind; thus a few monolayers of AlAs (layer 108) form on the surface and this AlAs retards further out diffusion and desorption of gallium. The thermodynamic equilibrium at the surface is probably

Figure 2:
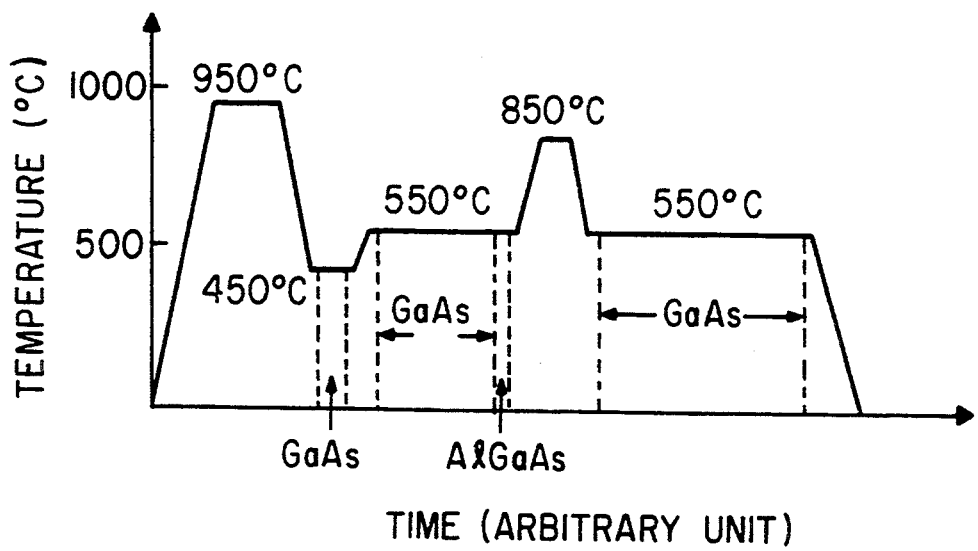
FIG. 2 is a time-temperature curve for the first preferred embodiment method.
Figure 3A:
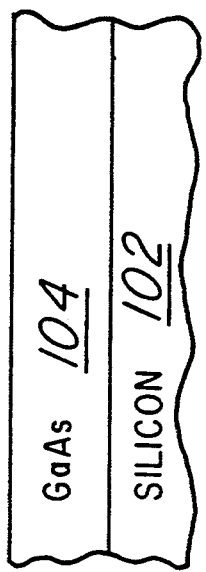
FIGS. 3a–d are cross sectional elevation views of the steps of the first preferred embodiment method.
Figure 3B:
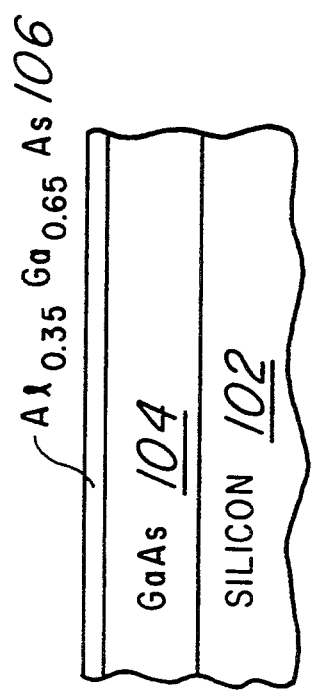
Figure 3C:
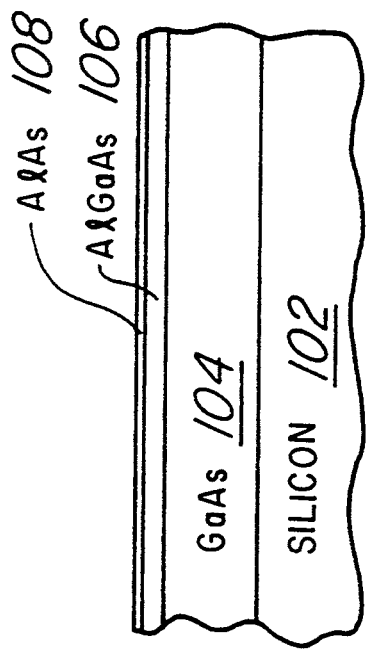

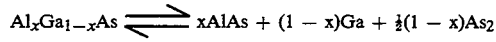

$$Al_xGa_{1-x}As \rightleftharpoons xAlAs + (1-x)Ga + \tfrac{1}{2}(1-x)As_2$$

the center of FIG. 2 and FIG. 3c. Note that without capping layer 106 and under the same arsenic atmosphere (about $10^{-5}$ torr) the highest temperature that could be used for in situ annealing would be about 700 C. because the congruent temperature for GaAs sublimation is about 640 C. and more than about 50 C. above the congruent temperature is a practical limit. (The congruent temperature for GaAs sublimation is the temperature at which the vapor pressures of the Ga and $As_2$ are equal.) In contrast, the congruent temperature for AlAs sublimation is about 800 C., and the $Al_xGa_{1-x}As/Gas$ interface is stable up to 900 C.

(e) Reduce the temperature of substrate 102 to 550 C. and resume growing GaAs to form layer 110 to a thickness of 2.5 μm. Note that AlAs layer 108 and $Al_xGa_{1-x}As$ layer 106 are essentially lattice matched to GaAs buffer layer 104 (the lattice mismatch of GaAs and $Al_xGa_{1-x}As$ is only 0.15x %, and layers 106 plus 108 are so thin than this mismatch would be compensated for by a strain). Thus GaAs layer 110 is grown at a low temperature on a lattice matched material which has a low dislocation density and, consequently, layer 110 has no twins and stacking faults plus a low dislocation density. See the righthand portion of FIG. 2 and FIG. 3d; FIG. 4 is a transmission electron microscopy (TEM) view of the same structure as in FIG. 3d but with different layer thicknesses. GaAs layer 110 does not need an ex situ anneal; experiments have shown that such an anneal does not provide any further improvement.

(f) Remove layered substrate 102 from the MBE machine and fore MESFET 112 (or any other devices) in GaAs layer 110 by standard processing; for example, ion implant a channel region plus source and drain regions, and deposit a Ti/Pt/Au gate and Ge/Ni/Au ohmic source and drain contacts by liftoff. This yields the structure of FIG. 1. Passivation, interconnections, and packaging complete the structure as part of an integrated circuit, but these have been omitted from the drawings for clarity.

Figure 5A:
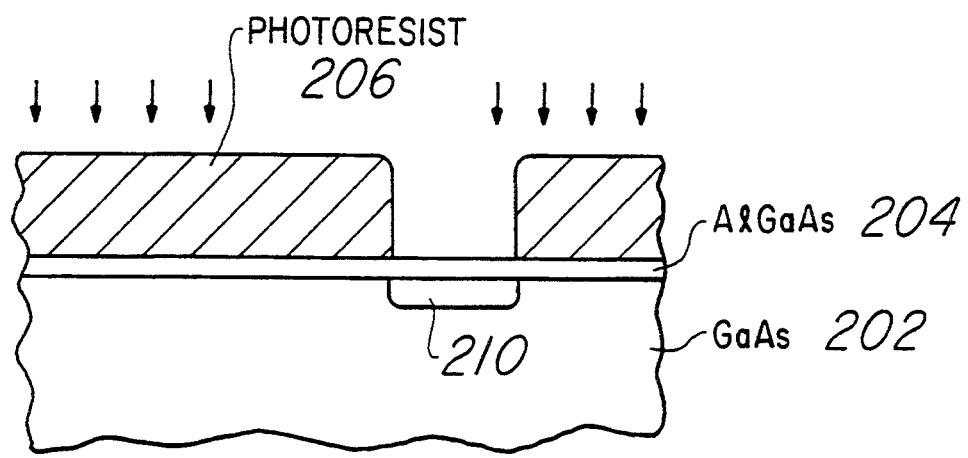
FIGS. 5a–b are cross section elevation views of the steps of a second preferred embodiment method.
Figure 5B:
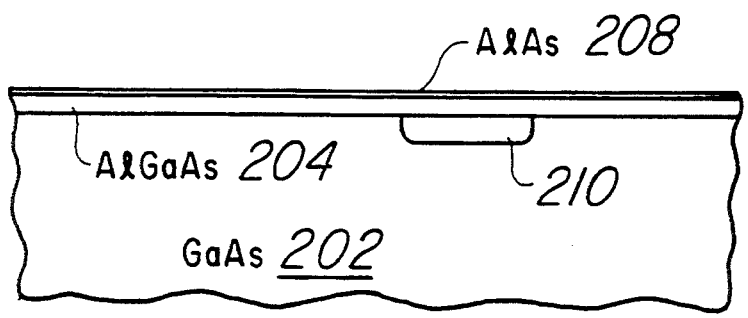

Note that GaAs and silicon have quite different coefficients of thermal expansion, so a low growth temperature will yield less thermal stress in the resultant structure. Thus the lower temperature MBE growth will be preferable to the higher MOCVD growth of GaAs on silicon. Further, MBE growth is cleaner than MOCVD growth due to the large amounts of carbon present from the metalorganic compounds used in MOCVD. The second preferred embodiment method uses a $Al_xGa_{1-x}As$ capping layer for the activation anneal of implanted GaAs includes the following steps as illustrated in cross sectional elevation view in Figures 5a–b.

Figure 3D:
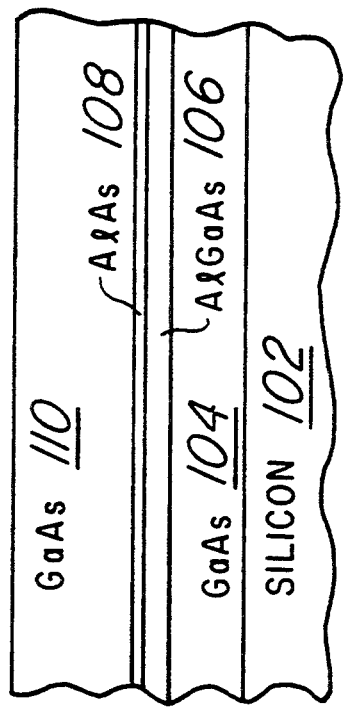
Figure 4:
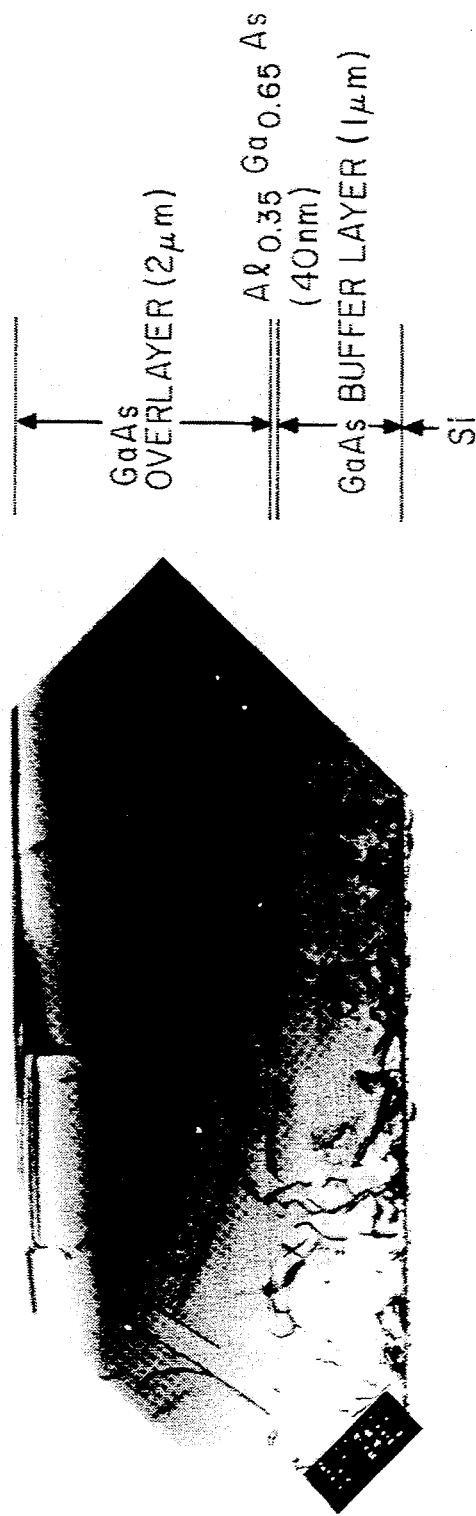
FIG. 4 is a transmission electron microscopy view of the first preferred embodiment structure.

(a) GaAs 202 (which may correspond to GaAs layer 110 of the structure shown in FIG. 3d) has $Al_xGa_{1-x}As$ capping layer 204 grown to a thickness of 0.05 μm (500 Å) and photoresist 206 spun on and exposed and developed. Then dopants, such as silicon, are ion implanted through $Al_xGa_{1-x}As$ layer 204 into GaAs 202 with patterned photoresist 206 as the implant mask to form impurity region 210 which also has a damaged crystal lattice. The implant typically would have a dose of $1 \times 10^{13}/cm^2$ at an energy of 100 keV for silicon ions to form n+ region 210; see FIG. 5a. Region 210 could be the base for an eventual heterojunction p-n-p bipolar transistor.

(b) Photoresist 206 is then stripped and the implant annealed with $Al_xGa_{1-x}As$ 204 as a cap in an arsenic atmosphere. As in the first preferred embodiment, gallium desorbs from the cap and leaves a few monolayers of AlAs 208 which prevent outdiffusion of further gallium. See FIG. 5b.

(c) After the anneal the AlAs 208 and the remaining $Al_xGa_{1-x}As$ 204 are removed from GaAs 202 with HF which selectively etches $Al_xGa_{1-x}As$ with respect to GaAs. Note that prior art methods use a cap of silicon nitride, but silicon nitride is amorphous (and not latticematched to GaAs 202) and stresses the GaAs at the interface which may lead to cracking of the GaAs layer. The use of lattice matched cap 204 avoids this stress.

Figure 6A:
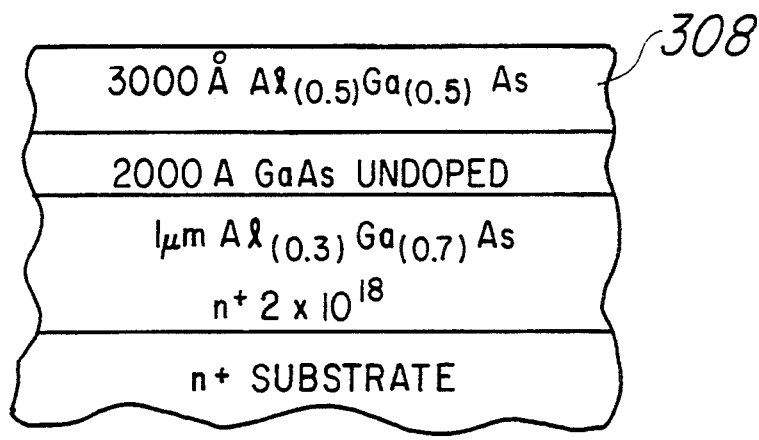
FIGS. 6a–b illustrate a third preferred embodiment method.
Figure 6B:
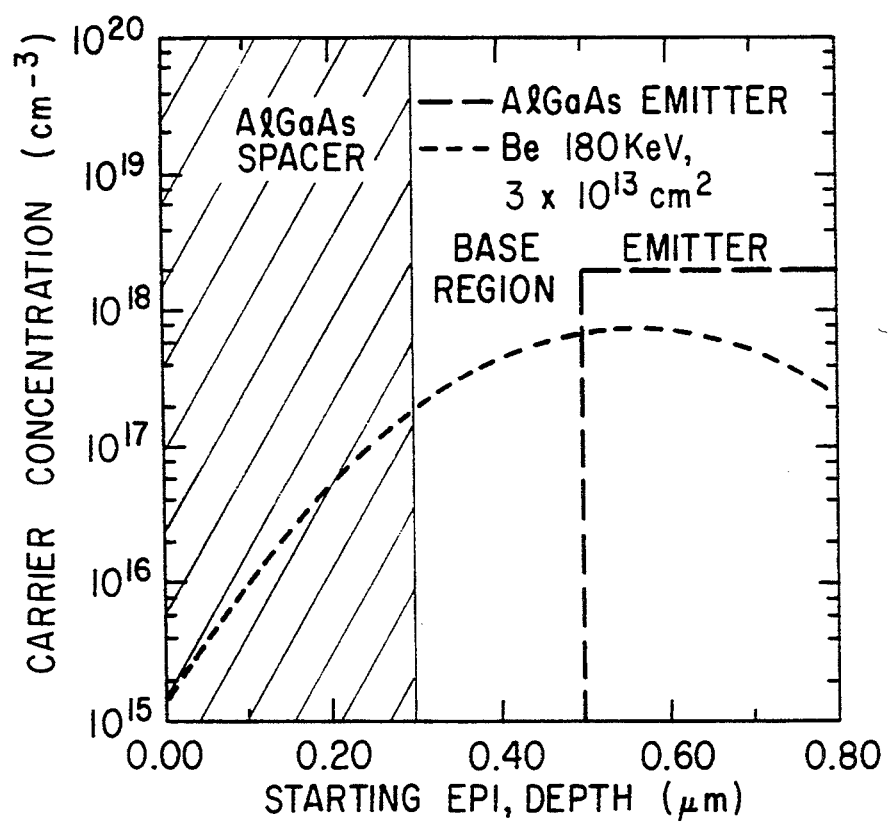

Third preferred embodiment method uses an epitaxial $Al_{0.5}Ga_{0.5}As$ cap as both an anneal cap and an implant spacer. FIGS. 6a–b illustrate the base formation process of an emitter-down overgrowth heterojunction bipolar transistor showing both the starting first epi in FIG. 6a and the base implant profile in FIG. 6b. In the overgrowth process, a spacer layer such as epitaxial $Al_{0.5}Ga_{0.5}As$ 308 or silicon nitride can be deposited over the base area to act as a spacer for adjusting the base implant depth. To maximize the electric field in the base such that the electron transit time is a minimum, the peak in the base doping concentration should occur at the emitter-base junction. The spacer thickness can be adjusted such that the peak of the implant occurs at the emitter/base interface for a given implant energy and fluence. The Mgh (50%) aluminum concentration in the $Al_xGa_{1-x}As$ spacer layer 308 permits easy removal from the underlying GaAs base surface after the activation anneal of the base implant. A further advantage of using $Al_xGa_{1-x}As$ 308 as the spacer layer instead of silicon nitride or other such material is that upon annealing $Al_xGa_{1-x}As$ acts as an arsenic rich cap to keep the base surface region from decomposing. Rapid thermal annealing precludes the use of arsenic over-pressure due to process complexity in a single wafer process; however, the arsenic rich cap, $Al_xGa_{1-x}As$ 308, helps maintain the GaAs surface perfection. After the removal of the spacer layer, the GaAs collector layer can be grown onto the base layer.

Fourth preferred embodiment method is similar to the third preferred embodiment except that the base is implanted through an $Al_xGa_{1-x}As$ spacer layer into the collector layer to fabricate an emitter-up HBT. Again, after the anneal, which is typically rapid thermal annealing, the $Al_xGa_{1-x}As$ cap is removed and the emitter is grown.

Fifth preferred embodiment method is analogous to the third and fourth preferred embodiments. After the complete growth of all the layers of a planar HBT, a spacer layer of $Al_xGa_{1-x}As$ with x~0.5 on top of the structure is used for improved implant activation and better ohmic contacts. In HBT fabrication the base is contacted by a P+ implant, through the spacer, and the collector is reached by a N+ implant, through the spacer. These implants require an activation anneal, typically rapid thermal annealing, where the use of arsenic over-pressure is not practical. The $Al_x, Ga_{1-x}As$ spacer layer will keep the surface arsenic rich and after its removal in HF, ohmic contact formation on the good, arsenic rich GaAs will be better.

MODIFICATIONS AND ADVANTAGES

Various modifications of the preferred embodiments may be made while retaining the feature of a related-material anneal cap and devices made with such anneals. For example, an $Al_xGa_{1-x}As/GaAs$ superlattice may be used as the anneal cap of AlGaAs in MBE; in this situation, the Al,Gal,As may be grown at a higher temperature (e.g., 600 C.) and the GaAs at a lower temperature (e.g., 550 C.) to obtain the benefits of both a compositional plus thermal-cycled superlattice (which blocks dislocation propagation) and an $Al_xGa_{1-x}As$ anneal cap. Further, in the first preferred embodiment the buffer layer and the top layer could be different materials such as $Al_xGa_{1-x}As$ with different x and each of the layers could incude sublayers with different x; indeed, material systems other than AlGaAs, such as GaAsP, InGaAs, InAlGaAsP, etc. or even II-VI systems, could be used with the lower vapor pressure component used as the capping layer. Additionally, various growth temperatures and temperature cycling could be used in the various material systems. Lattice matching of the cap to the annealed layer need only be close enough to avoid defects; thus a tMn strained layer cap could also be used. In the second preferred embodiment the annealing process could be a furnace anneal, a rapid thermal anneal, or other type of anneal or combination of anneals, and could be used with other material systems. Indeed, the starting substrate for the preferred embodiments and variations could be complex such as silicon-on-insulator or include recesses and amorphous material patterns such as silicon dioxide patterns on silicon. And in the third, fourth, and fifth preferred embodiments, devices other than HBTs could be fabricated (such as MESFETs and JFETs) by implantation and capped anneal, and integrated circuits of the various devices could be fabricated. With the related-material capped anneal the corresponding interfaces such as emitter/base and ohmic/semiconductor will have improved surface state densities and lower specific resistivities.

What is claimed is:

1. A method of forming a heteroepitaxial structure, comprising the steps of:
   (a) forming a heteroepitaxial layer of a second material on a layer of a first material;
   (b) forming a capping layer of a third material on said heteroepitaxial layer, wherein said capping layer is substantially lattice matched to said second material, and is composed of a compound semiconductor;

(c) annealing said heteroepitaxial and capping layers such that a constituent element of said compound semiconductor desorbs from a surface region of said capping layer, thereby forming a layer of a fourth material in said surface region of said capping layer, said layer of fourth material being a barrier to further desorption of said constituent element from said capping layer or said layer of second material; and (d) forming a top layer of material on said layer of fourth material, said top layer substantially lattice matched to said fourth material.

2. The method of claim 1, wherein:
(a) said first material is silicon;
(b) said second material is GaAs;
(c) said third material is $Al_xGa_{1-x}As$ for $0 < x \leq 1.0$;
(d) said fourth material is AlAs; and
(e) said top layer of material is GaAs.

3. The method of claim 2, wherein:
(a) said annealing is in an arsenic atmosphere at about 850° C.

4. The method of claim 1, wherein:
(a) said formings are by molecular beam epitaxial growth and said annealing is in situ.

5. The method of claim 1, wherein:
(a) said capping layer is a superlattice.

6. The method of claim 5, wherein:
(a) said superlattice is grown with temperature cycling.

7. The method of claim 1, wherein:
(a) said heteroepitaxial layer is formed by growth at a first temperature followed by growth at a second temperature which is higher than said first temperature.

* * * * *